United States Patent [19]

Arthur et al.

[11] Patent Number: 5,194,326
[45] Date of Patent: Mar. 16, 1993

[54] CERAMIC FILLED FLUOROPOLYMERIC COMPOSITE MATERIAL

[75] Inventors: David J. Arthur, Norwood; Gwo S. Swei, Northboro, both of Mass.; Allen F. Horn, III, Danielson, Conn.

[73] Assignee: Rogers Corporation, Rogers, Conn.

[21] Appl. No.: 704,320

[22] Filed: May 22, 1991

Related U.S. Application Data

[63] Continuation-in-part of Ser. No. 367,241, Jun. 16, 1989, Pat. No. 5,061,548, which is a continuation-in-part of Ser. No. 15,191, Feb. 17, 1987, Pat. No. 4,849,284, which is a continuation-in-part of Ser. No. 279,474, Dec. 2, 1988.

[51] Int. Cl.$^5$ .............................................. B32B 9/06
[52] U.S. Cl. .................................... 428/325; 428/143; 428/421; 428/422; 428/327; 428/209
[58] Field of Search ............... 428/327, 421, 422, 325, 428/427

[56] References Cited

U.S. PATENT DOCUMENTS

| | | | |
|---|---|---|---|
| 4,307,142 | 12/1981 | Blitstein et al. | 428/143 |
| 4,849,284 | 7/1989 | Arthur et al. | 428/325 |
| 4,983,459 | 1/1991 | Franz et al. | 428/410 |
| 4,987,274 | 1/1991 | Miller et al. | 174/102 |

Primary Examiner—Patrick J. Ryan
Assistant Examiner—Kam F. Lee
Attorney, Agent, or Firm—Fishman, Dionne & Cantor

[57] ABSTRACT

A composite material is presented comprised of a ceramic filled fluoropolymer wherein the ceramic is coated with a fluorosilane and the ceramic has a volume % fraction of between about 45-50.

23 Claims, 1 Drawing Sheet

CERAMIC FILLED FLUOROPOLYMERIC COMPOSITE MATERIAL

CROSS-REFERENCE TO RELATED APPLICATION

This is a continuation-in-part of U.S. application Ser. No. 367,241 filed Jun. 16, 1989 (now U.S. Pat. No. 5,061,548), which, in turn, is a continuation-in-part of U.S. application Ser. No. 015,191 filed Feb. 17, 1987, now U.S. Pat. No. 4,849,284 and this is a continuation-in-part of U.S. application Ser. No. 279,474 filed Dec. 2, 1988 is now pending.

BACKGROUND OF THE INVENTION

This invention relates to a fluoropolymeric composite material. More particularly, this invention relates to a fluoropolymeric composite material which is particularly well suited for use as a bonding ply in a multilayer circuit board and in other applications requiring the ability to flow as well as good thermal, mechanical and electrical properties.

U.S. Pat. No. 4,949,284, which is assigned to the assignee hereof and incorporated herein by reference describes a ceramic filled fluoropolymer-based electrical substrate material sold by Rogers Corporation under the trademark RO-2800. This electrical substrate material preferably comprises polytetrafluoroethylene filled with silica along with a small amount of microfiberglass. In an important feature of this material, the ceramic filler (silica) is coated with a silane coating material which renders the surface of the ceramic hydrophobic and provides improved tensile strength, peel strength and dimensional stability. The composite material of U.S. Pat. No. 4,849,284 discloses a volume % filler fraction (on a void free basis) of at least 50 for use as a circuit substrate or a bonding ply.

The ceramic filled fluoropolymer-based electrical substrate material of U.S. Pat. No. 4,849,284 is well suited for forming rigid printed wiring board substrate materials and exhibits improved electrical performance over other printed wiring board materials. Also, the low coefficients of thermal expansion and compliant nature of this electrical substrate material results in improved surface mount reliability and plated through-hole reliability. As is known, individual sheets of this electrical substrate material may be stacked to form a multilayer circuit board. In fact, thin film formulations of the material disclosed in U.S. Pat. No. 4,849,284 (and sold by Rogers Corporation under the trademark RO-2810) may be used as a bonding ply to bond together a plurality of stacked substrate layers so as to form the multilayer circuit board.

It will be appreciated that high volume fractions (greater than 55 volume %) of ceramic filler will significantly and adversely effect the rheology (e.g. flow) of the ceramic filled fluoropolymer composite. This is particularly important when the composite is used as a bonding film or in filling openings is previously rigid structures. While ceramic filler volume fractions of 50–55% provide significantly improved rheological properties relative to higher filler fractions, there is a perceived need to provide even better flow properties to the fluoropolymeric composite without appreciably altering the excellent thermal, mechanical and electrical properties.

SUMMARY OF THE INVENTION

It has now been discovered that the ceramic filler content of the material disclosed in U.S. Pat. No. 4,849,284 may be as low as 45 volume % on a void-free basis and still retain adequate thermal, mechanical and electrical properties to be used as a bonding ply in multilayer circuit materials and as a filling material for certain rigid structures.

It has also now been discovered that dramatically and unexpectedly improved results are obtained when the silane coating chosen is a fluorinated silane or a combination of fluorinated silanes and other (non-fluorinated) silanes. When compared to a printed wiring board substrate incorprating non-fluorinated silane coatings, the use of fluorinated silane coated ceramic will act to:

1. Lower the modulus (increase compliance);
2. Improve the flexural endurance;
3. Improve the ductility (increase the ultimate elongation);
4. Provide higher peel strength;
5. Provide lower water absorption.

Accordingly, the present invention comprises a ceramic filled fluoropolymer containing 45–50 volume % ceramic coated with a fluorosilane or a mixture of fluorosilane and other (non-fluorinated) silanes.

The ceramic filled fluoropolymeric composite material of the present invention has improved rheology relative to the material of U.S. Pat. No. 4,849,284 and is useful in those applications requiring access holes and feature filling by resin flow without an excessive increase in the material's z-axis CTE.

The above-discussed and other features and advantages of the present invention will be appreciated and understood by those of ordinary skill in the art from the following detailed description and drawings.

BRIEF DESCRIPTION OF THE DRAWING

Referring now to the drawings.

DESCRIPTION OF THE PREFERRED EMBODIMENT

Figure 1A:
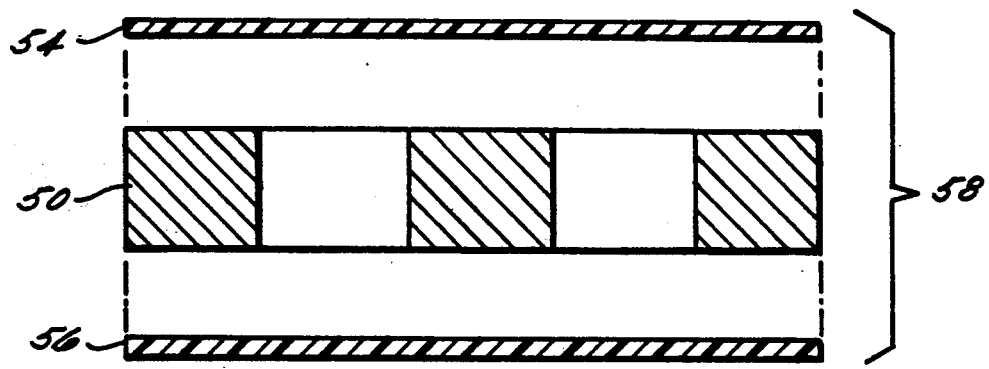
FIGS. 1A and 1B are respective cross-sectional elevation views of a rigid structure having openings prior and subsequent to being filled with the composite material of the present invention.

The ceramic filled fluoropolymeric composite of the present invention is substantially similar (including the method of manufacture) to the composite described in U.S. Pat. No. 4,849,284 (which has been fully incorporated herein by reference) with the exception that the ceramic is present on a void-free basis in an amount of as low as 45 volume % and the silane coating includes a fluorosilane. Thus, in a preferred embodiment, the present invention comprises a composite of particulate ceramic filler present at a volume fraction of about 0.45 to 0.50 and fluoropolymer (e.g. PTFE) present at a volume fraction of 0.50 to 0.55 on a void-free basis. The preferred ceramic filler is fused amorphous silica.

It has been discovered that dramatically improved results (relative to the above-discussed materials of U.S. Pat. No. 4,849,284) are obtained when the ceramic filler is coated with a fluorinated silane or a combination of fluorinated silanes and other, non-fluorinated silanes. In general, the fluorinated silane has the formula:

wherein X is a hydrolyzable functional group; Y is an organic group containing either a perfluorinated or a partially perfluorinated group, and each Z is either X, Y, or an alkyl groups.

Examples of suitable fluorinated silane coatings are described in U.S. application Ser. No. 279,474 filed Dec. 2, 1988, assigned to the assignee hereof and fully incorporated herein by reference. These examples include:
(3,3,3-trifluoropropyl)trichlorosilane,
(3,3,3-trifluoropropyl)dimethylchlorosilane,
(3,3,3-trifluoropropyl)methyldichlorosilane,
(3,3,3-trifluoropropyl)methyldimethoxysilane,
(Tridecafluoro-1,1,2,2-tetrahydrooctyl)-1-trichlorosilane,
(Tridecafluoro-1,1,2,2-tetrahydrooctyl)-1-methyldichlorosilane,
(Tridecafluoro-1,1,2,2-tetrahydrooctyl)-1-dimethylchlorosilane,
(Heptadecafluoro-1,1,2,2-tetrahydrodecyl)-1-methyldichlorosilane,
(Heptadecafluoro-1,1,2,2-tetrahydrodecyl)-1-trichlorosilane,
(Heptadecafluoro-1,1,2,2-tetrahydrodecyl)-1-dimethylchlorosilane
(Heptafluoroisopropoxy)propylmethyldichlorosilane,
3-(heptafluoroisopropoxy)propyltrichlorosilane, and
3-(heptafluoroisopropoxy)propyltriethoxysilane.

In a preferred embodiment of the present invention, the fluorinated silane coating comprises a perfluorinated alkyl silane having the formula:

where X is a hydrolyzable functional group, n=0 or a whole integer.

Because of the high cost of the above-mentioned fluorinated silanes, it has also been found that the desired composite properties may be achieved by using a mixture of the fluorinated silanes; or by blending one or more fluorinated silanes with one or more thermally stable silanes which contains no fluorine atoms in their chemical structure. Examples of such blends include a blending of (3,3,3-tifluoropropyl)trimethoxysilane with phenyltrimethoxysilane (which is known to be thermally stable); and a blending of (heptadecafluoro-1,1,2,2-tetrahydrodecyl)-1-trimethoxysilane with phenyltrimethoxysilane.

Overall, when compared to conventional RO-2800 using non-fluorinated silane coatings, the fluorinated silane coatings act to significantly (1) lower the modulus (so as to increase compliance); (2) increase the ultimate elongation (so as to improve ductility); (3) improve fracture endurance; (4) provide higher peel strength; and (5) lower water absorption. Moreover, all of the other excellent properties (e.g. DK, DF, CTE, dimensional stability, etc.) are basically unchanged from that of the conventional RO-2800 with non-fluorinated silane.

Finally, in the mixed or blended silanes, the increase of the fluorinated silane ratio in the silane mixture result in a more pronounced effect.

The improvements in flexibility is a particularly important feature of this invention. This improvement is dramatically shown in the Examples and Tables of aforementioned U.S. Ser. No. 279,474.

By this reduction in filler content, the rheology of the material of the present invention is improved to the point that it will "flow" and fill comparatively large openings in thick metal foils or inner layers of circuitry that cannot be filled by some of the highly filled (greater than 55 volume % fraction) materials disclosed in U.S. Pat. No. 4,849,284. The only required compositional difference between the present invention and the materials described in U.S. Pat. No. 4,849,284 application is the reduced level of particulate ceramic filler and the absence of glass microfiber in the present invention. The materials comprising the present invention can be produced either by "wet blending" PTFE polymer in dispersion with the ceramic filler and coagulation or by dry blending of PTFE fine powders with the ceramic filler.

An important feature of the present invention is the fact that the rheology is improved without excessively increasing the Z-axis coefficient of thermal expansion (CTE) of the material. The Z-axis CTE of the 45-50 volume % filler formulation has been measured to be about 70 ppm/°C. over the temperature range of $-55°$ to $+125°$ C.; no worse than that of the widely used FR4 epoxy-glass composite laminate. Multilayer circuit boards made from RO 2800 laminate bonded together with bonding ply layers of the present invention will exhibit an overall CTE considerably lower than that of an FR4 board. The decreased CTE is important in increasing the reliability of plated through holes to withstand thermal cycling.

Figure 1B:
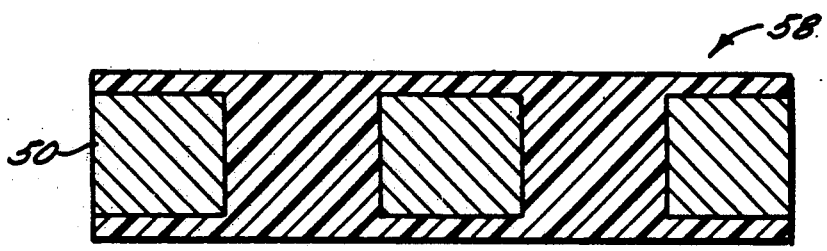

The present invention extends the number of applications in which ceramic filled PTFE composite materials can be used for constructing useful printed wiring boards. The present invention has the particular utility in filling openings in already rigid structures, such as etched CIC voltage or ground planes and restraining cores, or circuitry bonded to such structures. For example, in FIG. 1A, a rigid ground plane structure is depicted in cross-section at 50 several having openings 52. Sheets 54, 56 of the present invention (e.g., 0.45 to 0.50 volume fraction ceramic) are then positioned on either side of ground plane 50. In FIG. 1B, the stack-up 58 of FIG. 1A is laminated under heat and pressure. The composition of this invention will permit good flow so as to completely fill the openings while also providing excellent thermal, mechanical and electrical properties.

Figure 2:
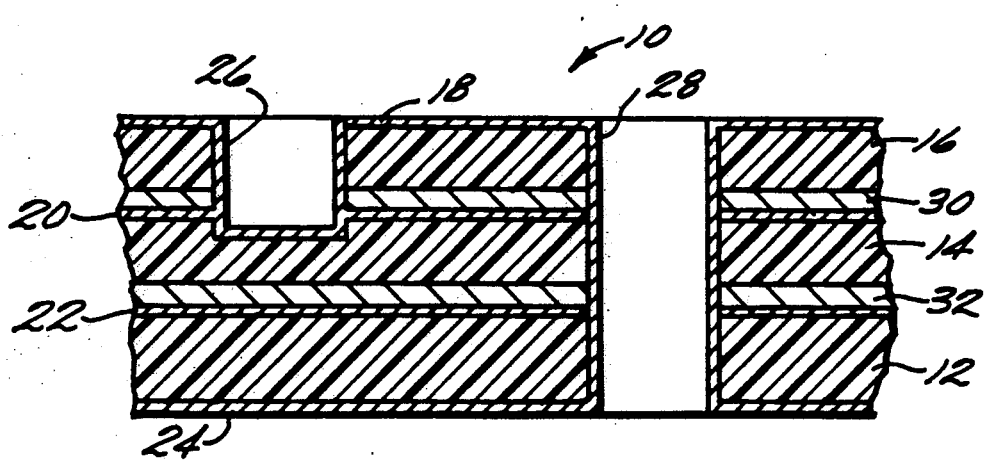
FIG. 2 is a cross-sectional elevation view of a multilayer circuit board employing the thermoplastic composite material in accordance with the present invention as a thin film bonding ply.

In addition and referring to FIG. 2, the composite of this invention may be processed into a sheet in its undensified, unsintered form and used for bonding multilayer printed wiring boards or constructing printed wiring boards by foil lamination. Turning now to FIG. 2, such a multilayer circuit board is shown generally at 10. Multilayer board 10 comprises a plurality of layers of substrate material 12, 14 and 16, all of which are comprised of an electrical substrate material, preferably the ceramic filled fluoropolymeric material of U.S. Pat. No. 4,849,284 sold under the RO-2800 trademark. Each substrate layer 12, 14 and 16 has a conductive pattern 18, 20, 22 and 24 respectively thereon. Note that a substrate layer having a circuit pattern thereon defines a circuit substrate. Plated through holes 26 and 28 interconnect selected circuit patterns in a known manner.

In accordance with the present invention, separate sheets 30 and 32 of substrate material having a composition in accordance with the present invention are used as an adhesive or bond ply to laminate individual circuit substrates together. In a preferred method of forming such a laminate, a stack-up of circuit substrates altered with one or more layers of the bond ply is made. This stack-up is then fusion bonded whereby the entire multilayer assembly is melted and fused into a homogeneous construction with consistent electrical and mechanical properties throughout. Significantly, note that the adhesive bond ply layers 30 and 32 may be used to laminate circuit substrates comprised of materials other than the silane coated ceramic filled fluoropolymer of U.S. Pat. No. 4,849,284. Although, in a preferred embodiment, a multilayer circuit board includes circuit substrates which are all comprised of the electrical substrate material of U.S. Pat. No. 4,849,284.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electrical substrate material comprising:
fluoropolymeric material;
ceramic filler material, said filler material being in an amount of at least about 45 to less than 50 volume percent of the total substrate material; and
said ceramic filler being coated with a fluorinated silane coating or a coating containing a mixture of a fluorinated silane and a non-fluorinated silane.

2. The material of claim 1 including:
at least one layer of conductive material being disposed on at least a portion of said electrical substrate material.

3. The material of claim 1 wherein said fluoropolymeric material is selected from the group comprising:
polytetrafluoroethylene, hexa fluoropropene, tetrafluoroethylene or perfluoro alkyl vinyl ether.

4. The material of claim 1 wherein said ceramic filler comprises silica.

5. The material of claim 1 wherein said fluorinated silane is selected from the group comprising:

where X is a hydrolyzable functional group;
Y is an organic group containing either a perfluorinated or a partially perfluorinated group; and
Z=X or Y or an alkyl group.

6. The material of claim 1 wherein said fluorinated silane is selected from the group comprising:
(3,3,3-trifluoropropyl)trichlorosilane,
(3,3,3-trifluoropropyl)dimethylchlorosilane,
(3,3,3-trifluoropropyl)methyldichlorosilane,
(3,3,3-trifluoropropyl)methyldimethoxysilane,
(Tridecafluoro-1,1,2,2-tetrahydrooctyl)-1-trichlorosilane,
(Tridecafluoro-1,1,2,2-tetrahydrooctyl)-1-methyldichlorosilane,
(Tridecafluoro-1,1,2,2-tetrahydrooctyl)-1-dimethylchlorosilane,
(Heptadecafluoro-1,1,2,2-tetrahydrodecyl)-1-methyldichlorosilane,
(Heptadecafluoro-1,1,2,2-tetrahydrodecyl)-1-trichlorosilane,
(Heptadecafluoro-1,1,2,2-tetrahydrodecyl)-1-dimethylchlorosilane
(Heptafluoroisopropoxy)propylmethyldichlorosilane,
3-(heptafluoroisopropoxy)propyltrichlorosilane, and
3-(heptafluoroisopropoxy)propyltriethoxysilane.

7. The material of claim 1 wherein said fluorinated silane is selected from the group comprising:

$$CF_3(CF_2)_n-CH_2CH_2-Si-X$$

where X is a hydrolyzable functional group; and n=0 or a whole integer.

8. The material of claim 1 wherein said fluorinated silane is selected from the group comprising:
(3,3,3-trifluoropropyl) trimethoxy silane, Tridecafluoro-1,1,2,2-tetrahydrooctyl-1-Triethoxy silane, and heptadecafluoro-1,1,2,2-tetrahydrodecyl-triethoxy silane.

9. In a multilayer circuit including at least a first circuit layer and a second circuit layer, the improvement comprising:
an adhesive layer sandwiched between the first and second circuit layers, said adhesive layer comprising:
fluoropolymeric material;
ceramic filler material, said filler material being in an amount of at least about 45 to less than 50 volume percent of the total adhesive layer; and
said ceramic filler being coated with a fluorinated silane coating or a coating containing a mixture of a fluorinated silane and a non-fluorinated silane.

10. The multilayer circuit of claim 8 including:
at least one plated through hole.

11. The multilayer circuit of claim 9 wherein said fluoropolymeric material is selected from the group comprising:
polytetrafluoroethylene, hexa fluoropropene, tetrafluoroethylene or perfluoro alkyl vinyl ether.

12. The multilayer circuit of claim 9 wherein said ceramic filler comprises silica.

13. The multilayer circuit of claim 9 wherein said fluorinated silane is selected from the group comprising:

where X is a hydrolyzable functional group;
Y is an organic group containing either a perfluorinated or a partially perfluorinated group; and
Z=X or Y or an alkyl group.

14. The multilayer circuit of claim 9 wherein said fluorinated silane is selected from the group comprising:
(3,3,3-trifluoropropyl)trichlorosilane,
(b 3,3,3-trifluoropropyl)dimethylchlorosilane,
(3,3,3-trifluoropropyl)methyldichlorosilane,
(3,3,3-trifluoropropyl)methyldimethoxysilane,
(Tridecafluoro-1,1,2,2-tetrahydrooctyl)-1-trichlorosilane, (Tridecafluoro-1,1,2,2-tetrahydrooctyl)-1-methyldichlorosilane,
(Tridecafluoro-1,1,2,2-tetrahydrooctyl)-1-dimethylchlorosilane,
(Heptadecafluoro-1,1,2,2-tetrahydrodecyl)-1-methyldichlorosilane,
(Heptadecafluoro-1,1,2,2-tetrahydrodecyl)-1-trichlorosilane,
(Heptadecafluoro-1,1,2,2-tetrahydrodecyl)-1-dimethylchlorosilane
(Heptafluoroisopropoxy)propylmethyldichlorosilane,
3-(heptafluoroisopropoxy)propyltrichlorosilane, and
3-(heptafluoroisopropoxy)propyltriethoxysilane.

15. The multilayer circuit of claim 9 wherein said fluorinated silane is selected from the group comprising:

$$CF_3(CF_2)_n-CH_2CH_2-Si-X$$

where X is a hydrolyzable functional group; and
n=0 or a whole integer.

16. The material of claim 9 wherein said fluorinated silane is selected from the group comprising:
(3,3,3-trifluoropropyl) trimethoxy silane, Tridecafluoro-1,1,2,2-tetrahydrooctyl-1-Triethoxy silane, and heptadecafluoro-1,1,2,2-tetrahydrodecyl-triethoxy silane.

17. An article comprising:
a rigid substrate, said rigid substrate having at least one opening at least partially through said substrate;
a composite material in said at least one opening, said composite material including;
fluoropolymeric material;
ceramic filler material, said filler material being in an amount of at least about 45 to 50 volume percent of the total composite material; and
said ceramic filler being coated with a fluorinated silane coating or a coating containing a mixture of a fluorinated silane and a non-fluorinated silane.

18. The article of claim 17 wherein said fluoropolymeric material is selected from the group comprising:
polytetrafluoroethylene, hexa fluoropropene, tetrafluoroethylene or perfluoro alkyl vinyl ether.

19. The article of claim 17 wherein said ceramic filler comprises silica.

20. The article of claim 17 wherein said fluorinated silane is selected from the group comprising:

$$X-\underset{\underset{Z}{|}}{\overset{\overset{Z}{|}}{Si}}-Y$$

where X is a hydrolyzable functional group;
Y is an organic group containing either a perfluorinated or a partially perfluorinated group; and
Z=X or Y or an alkyl group.

21. The article of claim 17 wherein said fluorinated silane is selected from the group comprising:
(3,3,3-trifluoropropyl)trichlorosilane,
(3,3,3-trifluoropropyl)dimethylchlorosilane,
(3,3,3-trifluoropropyl)methyldichlorosilane,
(3,3,3-trifluoropropyl)methyldimethoxysilane,
(Tridecafluoro-1,1,2,2-tetrahydrooctyl)-1-trichlorosilane,
(Tridecafluoro-1,1,2,2-tetrahydrooctyl)-1-methyldichlorosilane,
(Tridecafluoro-1,1,2,2-tetrahydrooctyl)-1-dimethylchlorosilane,
(Heptadecafluoro-1,1,2,2-tetrahydrodecyl)-1-methyldichlorosilane,
(Heptadecafluoro-1,1,2,2-tetrahydrodecyl)-1-trichlorosilane,
(Heptadecafluoro-1,1,2,2-tetrahydrodecyl)-1-dimethylchlorosilane
(Heptafluoroisopropoxy)propylmethyldichlorosilane,
3-(heptafluoroisopropoxy)propyltrichlorosilane, and
3-(heptafluoroisopropoxy)propyltriethoxysilane.

22. The article of claim 17 wherein said fluorinated silane is selected from the group comprising:

$$CF_3(CF_2)_n-CH_2CH_2-Si-X$$

where X is a hydrolyzable functional group; and
n=0 or a whole integer.

23. The article of claim 17 wherein said fluorinated silane is selected from the group comprising:
(3,3,3-trifluoropropyl) trimethoxy silane, Tridecafluoro-1,1,2,2-tetrahydrooctyl-1-Triethoxy silane, and heptadecafluoro-1,1,2,2-tetrahydrodecyl-triethoxy silane.

* * * * *